(12) United States Patent
Hoffman et al.

(10) Patent No.: US 7,629,582 B2
(45) Date of Patent: Dec. 8, 2009

(54) DUAL BAND IMAGER WITH VISIBLE OR SWIR DETECTORS COMBINED WITH UNCOOLED LWIR DETECTORS

(75) Inventors: Alan W. Hoffman, Goleta, CA (US); Michael Ray, Goleta, CA (US); Richard E. Bornfreund, Camarillo, CA (US)

(73) Assignee: Raytheon Company, Waltham, MA (US)

( * ) Notice: Subject to any disclaimer, the term of this patent is extended or adjusted under 35 U.S.C. 154(b) by 83 days.

(21) Appl. No.: 11/586,323

(22) Filed: Oct. 24, 2006

(65) Prior Publication Data
US 2008/0093554 A1 Apr. 24, 2008

(51) Int. Cl.
*G01J 5/02* (2006.01)

(52) U.S. Cl. .............................. 250/339.01; 250/338.1; 250/339.03; 257/21; 257/440

(58) Field of Classification Search ............ 250/339.01, 250/338.1, 339.02, 339.03; 257/21, 440
See application file for complete search history.

(56) References Cited

U.S. PATENT DOCUMENTS

| | | | |
|---|---|---|---|
| 5,149,956 A * | 9/1992 | Norton | 257/188 |
| 5,581,084 A * | 12/1996 | Chapman et al. | 250/338.4 |
| 5,808,350 A | 9/1998 | Jack et al. | |
| 6,667,479 B2 * | 12/2003 | Ray | 250/338.1 |
| 2002/0185600 A1* | 12/2002 | Kerr | 250/330 |
| 2003/0001093 A1* | 1/2003 | Wood | 250/332 |
| 2006/0043297 A1* | 3/2006 | Ouvrier-Buffet et al. | 250/339.05 |

* cited by examiner

*Primary Examiner*—David P Porta
*Assistant Examiner*—Jessica L Eley
(74) *Attorney, Agent, or Firm*—Leonard A. Alkov

(57) ABSTRACT

A dual band imager includes a radiation absorbing layer for absorbing light of a first wavelength coupled to a readout circuit (ROIC), and at least one radiation detector for detecting light of a second wavelength coupled to the ROIC via a corresponding opening extending through the radiation absorbing layer.

18 Claims, 4 Drawing Sheets

DUAL BAND IMAGER WITH VISIBLE OR SWIR DETECTORS COMBINED WITH UNCOOLED LWIR DETECTORS

TECHNICAL FIELD

The exemplary and non-limiting embodiments of this invention relate generally to detectors of thermal energy and, more particularly, relate to a combination dual band imager responsive to Infrared Radiation (IR).

BACKGROUND

Night vision imagers operate to sense reflected visible or short wave infrared (SWIR) light for high resolution images and long wave infrared (LWIR) radiation for thermal imaging. Some night vision imagers, such as the U.S. Army's Enhanced Vision Goggles (ENVGs) and the multiple-adaptable night tactical imaging system (MANTIS) sense both short wave and long wave radiation simultaneously as both wavelengths provide independent image information.

These existing systems require separate sensors for detecting both SWIR radiation and LWIR radiation. The use of two sensors results in the approximate doubling of both the size and the weight of these systems. When employed in helmet-mounted or hand-held night vision systems, the additional size and weight can present a rather severe disadvantage to the user. In addition, it is typically a requirement that night vision sensors operate at or near ambient temperature in order to reduce the size, weight, and power of the sensor. Therefore, a system that combines visible or SWIR radiation sensing with LWIR radiation sensing is most useful as a portable night vision detector when capable of operating at or near ambient temperatures.

SUMMARY

The foregoing and other problems are overcome, and other advantages are realized, in accordance with the exemplary embodiments of these teachings.

In accordance with an exemplary embodiment of the invention, a dual band imager includes a radiation absorbing layer for absorbing light of a first wavelength coupled to a readout circuit (ROIC), and at least one radiation detector for detecting light of a second wavelength coupled to the ROIC via a corresponding opening extending through the radiation absorbing layer.

In accordance with another exemplary embodiment of the invention, an apparatus includes a dual band imager for outputting image information, including a radiation absorbing layer for absorbing light of a first wavelength coupled to a readout circuit (ROIC), and at least one radiation detector for detecting light of a second wavelength coupled to the ROIC via a corresponding opening extending through the radiation absorbing layer, a processor coupled to the dual band imager for processing the image information, and a display coupled to the processor for displaying the processed image information.

In accordance with another exemplary embodiment of the invention, a method includes providing a LWIR detector including a radiation absorbing layer coupled to a readout circuit (ROIC), and fabricating at least one SWIR detector that is coupled to the ROIC via a corresponding opening extending through the radiation absorbing layer.

In accordance with another exemplary embodiment of the invention, an apparatus includes a dual band imager for outputting image information, including a radiation absorbing layer for absorbing light of a first wavelength coupled to a readout circuit (ROIC), and at least one radiation detector for detecting light of a second wavelength coupled to the ROIC via a corresponding opening extending through the radiation absorbing layer, an element for processing coupled to the dual band imager for processing the image information, and an element for displaying coupled to the processing element for displaying the processed image information.

In accordance with another exemplary embodiment of the invention, a method includes receiving an input image information comprising a first image information corresponding to light of a first wavelength and a second image information corresponding to light of a second wavelength and co-registered with the first image information, and processing the image information to create an output image.

In accordance with another exemplary embodiment of the invention, a signal bearing medium tangibly embodying a program of machine-readable instructions executable by a digital processing apparatus performs operations including receiving an input image information comprising a first image information corresponding to light of a first wavelength and a second image information corresponding to light of a second wavelength and co-registered with the first image information, and processing the image information to create an output image.

BRIEF DESCRIPTION OF THE DRAWINGS

The foregoing and other aspects of the exemplary embodiments of this invention are made more evident in the following Detailed Description, when read in conjunction with the attached Drawing Figure, wherein.

DETAILED DESCRIPTION

Exemplary and non-limiting embodiments of the invention disclose a dual band imager that combines both a visible or SWIR radiation detector with a LWIR radiation absorber/detector on a single focal plane. In an exemplary embodiment, an uncooled LWIR detector, coupled to a readout integrated circuit (ROIC) is modified to incorporate openings providing space for interconnects, such as indium bumps. The indium bumps enable the combination of the LWIR detector 3 with a SWIR photovoltaic (PV) detector 5 array on the same ROIC. As a result, two distinct types of detectors are combined onto a single ROIC.

Figure 1:
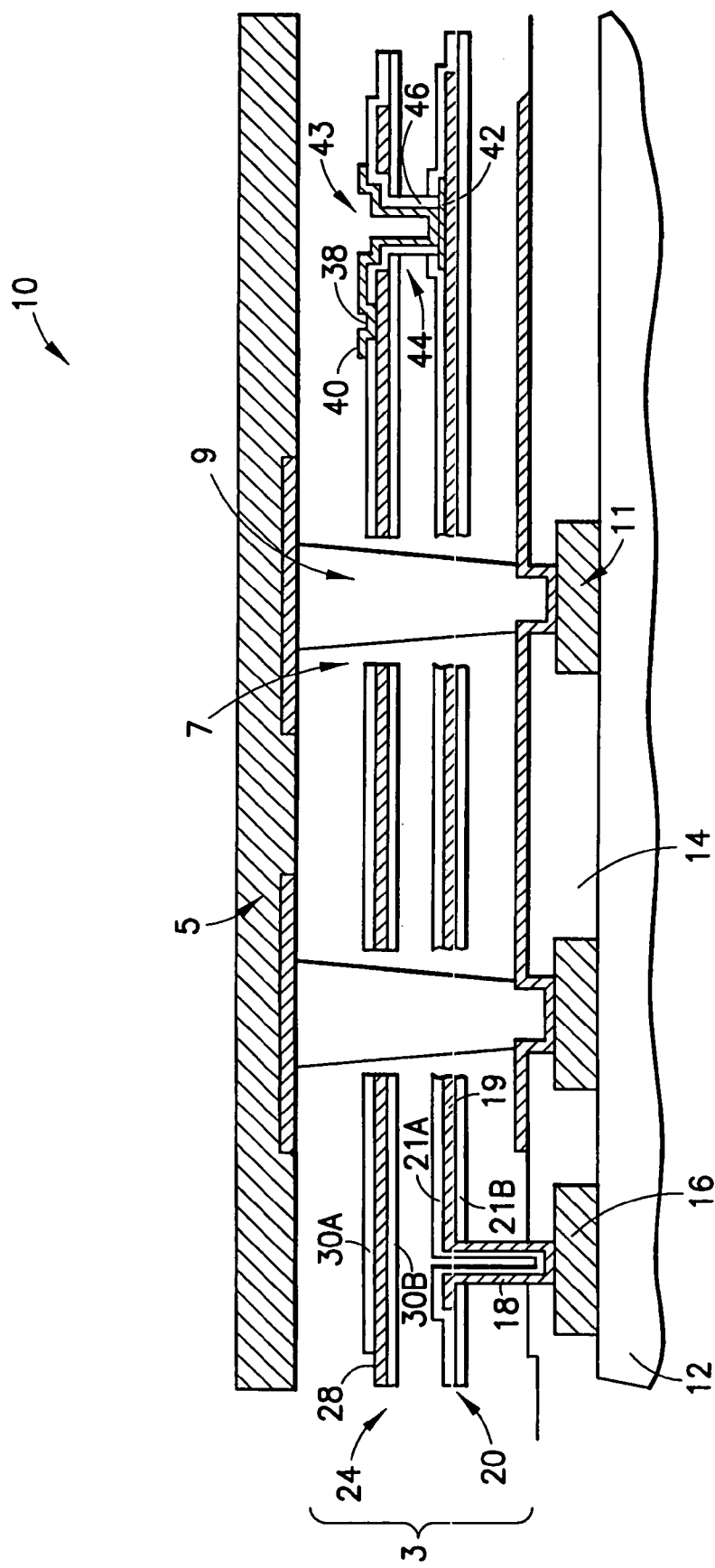
FIG. 1 is a cross-section diagram of a dual band detector according to an exemplary embodiment the invention.

With reference to FIG. 1, there is illustrated in cross-section a dual band detector 10 according to an exemplary embodiment of the invention. As will be described more fully below, the dual band detector 10 is formed of a combination of an uncooled LWIR detector array with a visible or SWIR PV detector array on the same ROIC 12. In the exemplary embodiment illustrated, the uncooled LWIR detector 24 is a Vanadium Oxide (VOx) microbolometer. Examples of SWIR PV detector 5 arrays include, but are not limited to, Si PIN (p-intrinsic-n), InGaAs, and HgCdTe photodiodes. These PV detector 5 arrays can operate at or near ambient temperature (between ~240 and 320° K) and can be fabricated in a manner that renders them substantially transparent to LWIR radiation.

As noted above, the illustrated exemplary embodiment of the dual band detector 10 is a hybrid formed of an uncooled LWIR detector array 3 (e.g., a VOx microbolometer) and an SWIR PV detector 5 array. There is therefore described, with reference to FIG. 1, the configuration of the elements forming a VOx microbolometer and, following, the modifications to the VOx microbolometer arising from the combination with a SWIR PV detector 5 array according to exemplary embodiments of the invention.

Bolometers, in particular microbolometers, are employed as detector pixel elements in two dimensional arrays of thermal (IR) detectors. The two dimensional array of microbolometers converts the IR, particularly LWIR, arriving from a scene of interest into electrical signals that are applied to a readout integrated circuit (ROIC) 12. After amplification and desired signal shaping and processing, the resulting signals can be further processed as desired to provide an image of the scene of interest.

A microbolometer typically includes a polycrystalline semiconductor material, such as Vanadium oxide ($VO_x$) or Titanium oxide, having an electrical resistivity that varies as a function of temperature. An absorber of IR, such as SiN, is provided in intimate contact with the polycrystalline semiconductor material so that its temperature can be changed as the amount of IR arriving from the scene changes. The polycrystalline semiconductor/absorber structure is typically thermally isolated from the underlying ROIC 12.

In the exemplary embodiment illustrated, the dual band detector 10 is fabricated over a ROIC 12, which may be silicon, and which may have a planarized oxide ($SiO_2$) layer 14 disposed on an upper-most surface thereof. A unit cell metal contact 16 is assumed to electrically connect the LWIR detector array 3 (microbolometer) to the ROIC electronics (not shown). A first upstanding leg 18 connects a substantially planar lower-level thermal isolation leg structure 20 to the unit cell metal contact 16. The leg 18 may be considered to define the "thermally sunk" end of the lower-level thermal isolation leg structure 20. In an exemplary and non-limiting embodiment of the invention, the thermal isolation leg structure 20 is a SiN/NiCr/SiN composite, wherein a NiCr layer 19 is sandwiched between upper and lower silicon nitride (SiN) layers 21A and 21B, respectively.

A radiation absorbing layer, such as a LWIR detector 24, is constructed of a $VO_x$ (or equivalent thermal resistivity material) layer 28 which functions as the active resistor or thermistor. The $VO_x$ thermistor layer 28 is sandwiched between upper and lower IR absorbing silicon nitride (SiN) layers 30A and 30B, respectively. The delineation of the LWIR detector 24 can be achieved through the use of a reactive ion etch (RIE) of the SiN layers 30A and 30B.

An electrical contact 38 is formed to the $VO_x$ layer 28 with metalization 40, which also forms a contact 42 with the NiCr layer 19 of the lower-level thermal isolation leg structure 20. The metalization 40 is carried through a second upstanding leg structure 44, and is surrounded by a silicon nitride sleeve 46.

In contrast to typical constructions of LWIR detector arrays 3, the dual band detector 10 includes a plurality of apertures 7 fabricated through at least the LWIR detector 24 in order to incorporate SWIR detectors 5. In accordance with an exemplary embodiment of the invention, the apertures 7 are etched through the layers of the LWIR detector 24 using an RIE, an ion mill and RIE to etch through the separate layers, or the chemistry of the RIE can be altered (CF4 vs. CHF3) to etch through the layers near simultaneously. Each aperture 7 forms a conduit for an electrical signal from a SWIR detector 5 to the ROIC 12. Indium bumps are typically used in hybrid arrays where an IR sensitive detector material is on one layer and the signal transmission and processing circuitry is on another layer, such as ROIC 12. In the exemplary embodiment illustrated, indium bumps 9 extend through the apertures 7 to provide both the electrical and physical coupling of each SWIR detector 5 to the ROIC 12. Specifically, indium bumps 9 provide the coupling of each SWIR detector 5 to a SWIR ROIC contact 11.

While illustrated showing the indium bumps 9 on each SWIR detector 5 and hybridized, via SWIR ROIC contacts 11, to the ROIC 12, the indium bumps 9 can be on the ROIC 12, a SWIR detector 5, or both. As noted above, each SWIR detector 5, including the substrate and coating materials, is sufficiently transparent to LWIR radiation such that LWIR radiation can pass through the SWIR detector 5 and be absorbed by the LWIR detector 24. While such transparency is typically inherent in visible and SWIR detector 5 materials, the dual band detector 10 is fabricated so as not to substantially block the LWIR detector 24 with metal or other structures that can function to absorb or reflect LWIR. In exemplary embodiments of the invention, the indium bumps 9 have a cross section approximately equal to 5 um at one end.

While the dimensions of the components of the dual band detector 10 can vary, in exemplary embodiments of the invention the separation, or hybridization gap, between the ROIC 12 and the SWIR detectors 5 is between approximately 6 um and 12 um and the separation between the ROIC 12 and the thermal isolation leg structure 20 is approximately 1 um.

Figure 2:
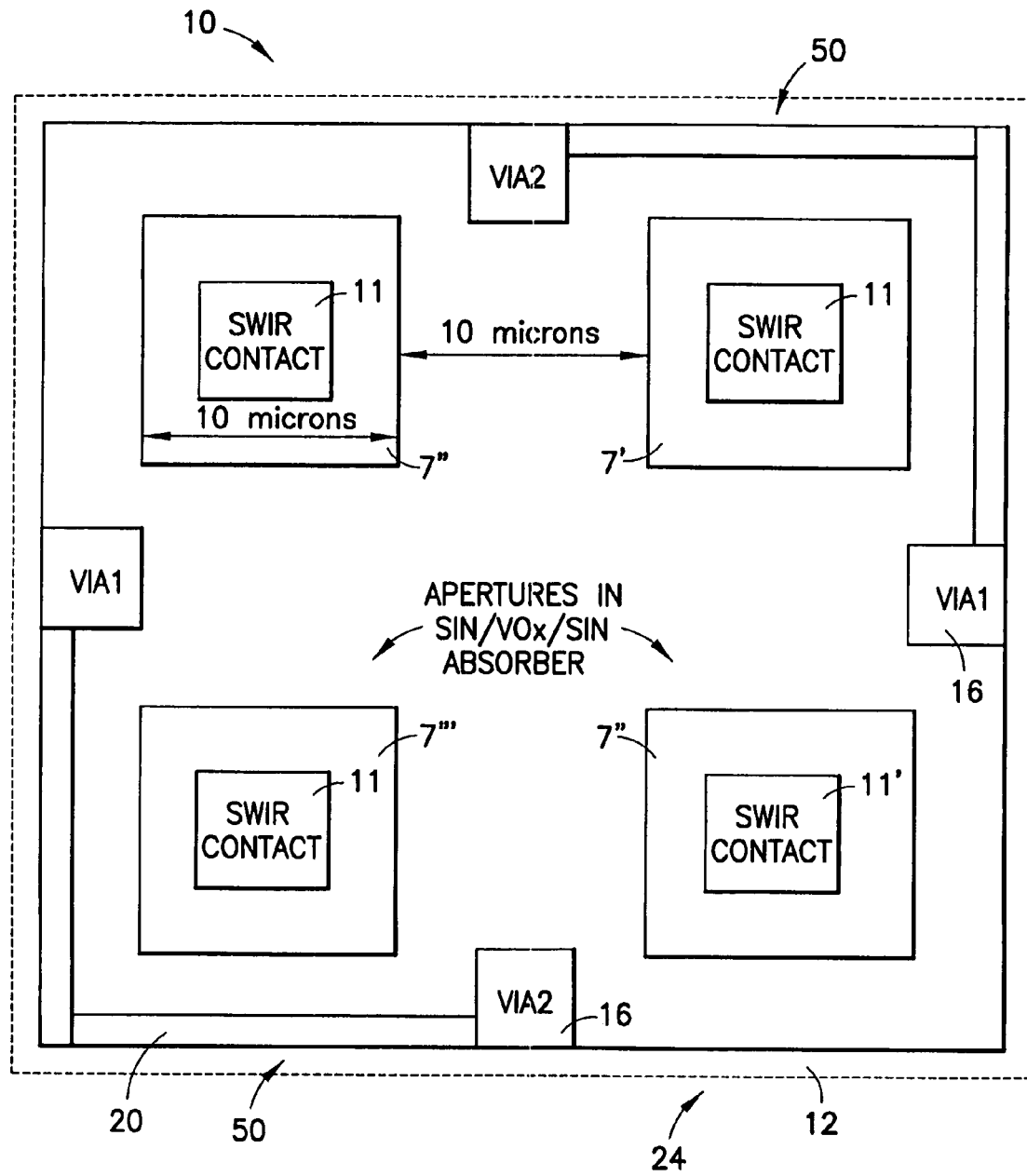
FIG. 2 is a diagram of a dual band detector according to an exemplary embodiment the invention.

With reference to FIG. 2, there is illustrated a top view of a dual band detector 10 according to an exemplary embodiment of the invention. As illustrated, there are two legs 50, formed in part from portions of lower-level thermal isolation leg structures 20, that suspend and thermally isolate the VOx detector 43 (not shown) above the ROIC 12. As illustrated, four apertures 7-7''' extend through the LWIR detector 24 and through which the indium bumps 9 (not shown) extend. As described above, indium bumps 9 provide at least an electrical coupling between SWIR detectors 5 and SWIR ROIC contacts 11. As illustrated, the unit metal contacts 16 coupled to the LWIR detector 24 have a pitch, measured center-to-center, approximately twice that of the SWIR detectors 5 as evidenced by the center-to-center spacing of horizontally and vertically adjacent SWIR ROIC contacts 11. In the exemplary embodiment shown, the distance between the apertures 7 can be as small as approximately ten microns. While the exemplary embodiment shows four SWIR detectors 5 on one dual band detector 10, the ratio of SWIR detectors 5 to one dual band detector 10 can be varied depending on the pixel size of the SWIR detector 5.

While the dimensions of the components of the dual band detector 10 can vary, in exemplary embodiments of the invention the footprint of each SWIR detector 5 is between approximately 15 um and 25 um on each side and, typically, approximately 20 um on a side. A typical dimension for an LWIR detector 24 is approximately twice that of an SWIR detector 5, or between approximately 30 um and 50 um on a side, usually approximately 40 um on a side.

Figure 3:
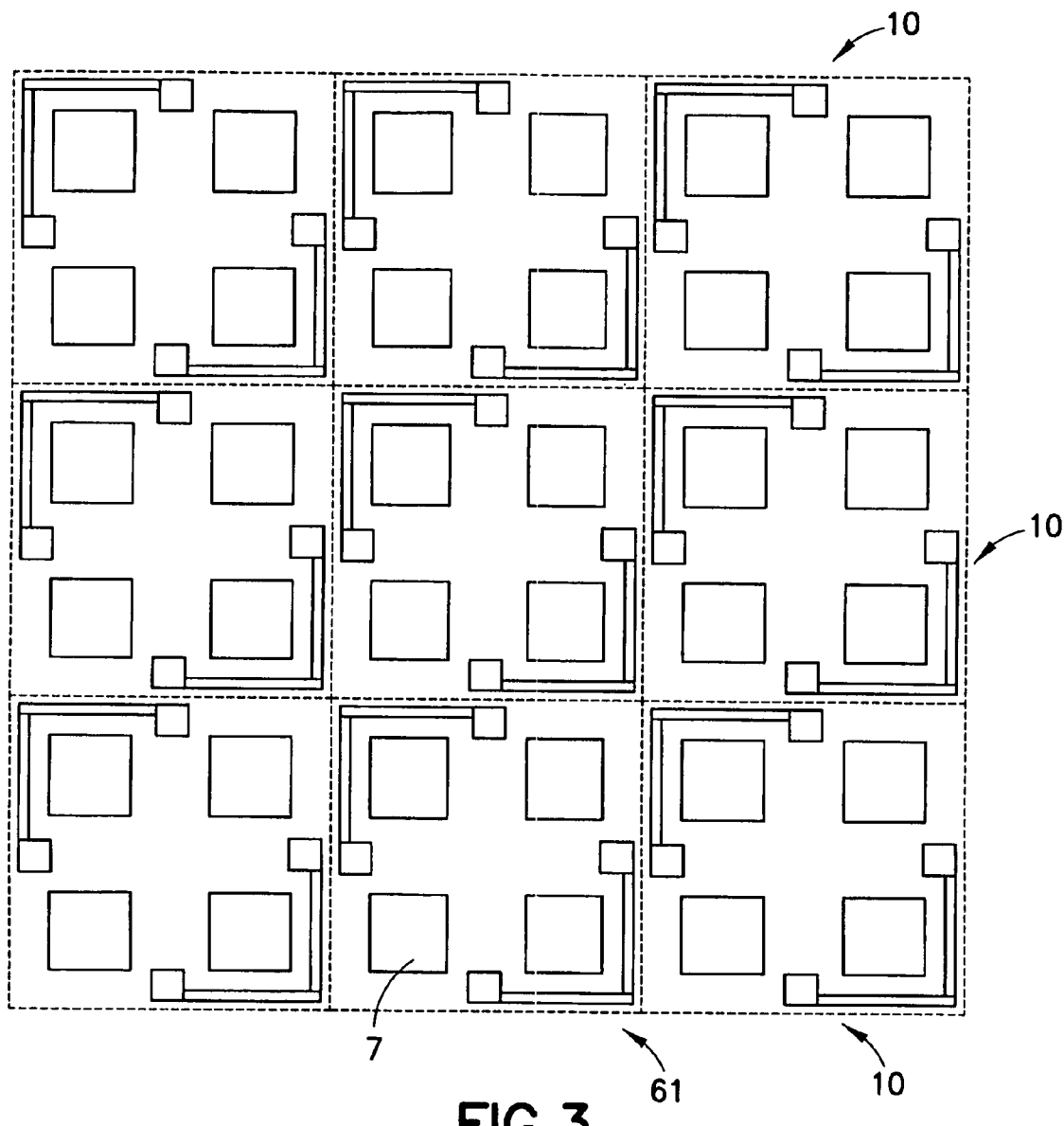
FIG. 3 is a diagram of an array of dual band detectors according to an exemplary embodiment the invention.

With reference to FIG. 3, there is illustrated an array 61 of dual band detectors 10 according to an exemplary embodiment of the invention. As illustrated, the 3X3 array 61 incorporates openings for a 6X6 array of apertures 7 and the corresponding indium bumps 9.

Figure 5:
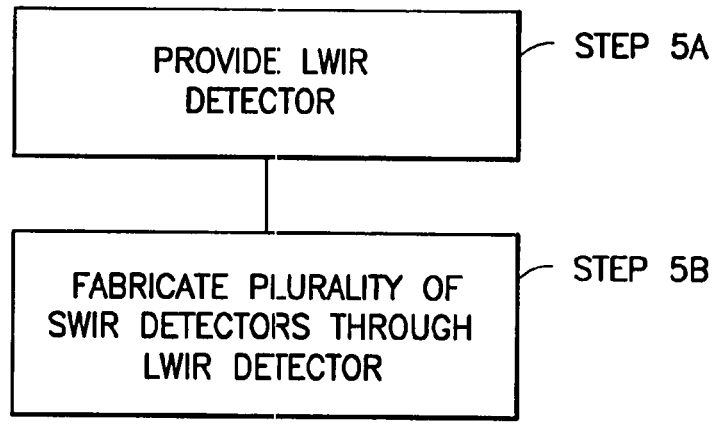
FIG. 5 is a flow diagram of a method according to an exemplary embodiment of the invention.

With reference to FIG. 5, there is shown a flow diagram of a method according to exemplary and non-limiting embodiments of the invention. At step 5A, a LWIR detector 24 is provided. At step 5B, in accordance with the exemplary embodiment discussed above, a plurality of SWIR detectors 5 are fabricated to extend through the LWIR detector 24 formed, in part, of a LWIR radiation absorbing layer. As discussed above, both the SWIR detectors 5 and the LWIR detector 24 are coupled to an ROIC 12.

Figure 4:
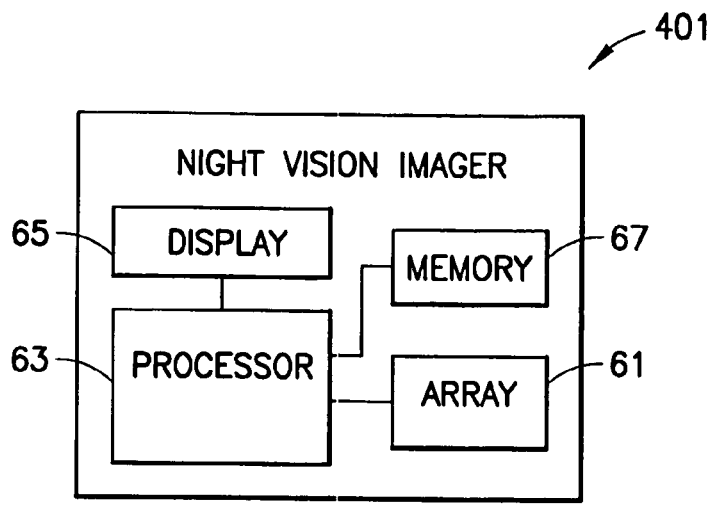
FIG. 4 is a diagram of a night vision imager incorporating a dual band imager according to an exemplary embodiment of the invention.

With reference to FIG. 4, there is illustrated a night vision imager 401 in accordance with an exemplary embodiment of the invention. Examples of night vision imagers 401 that may be adapted to include the dual band imager 10 according to exemplary embodiments of the invention include, but are not limited to, the U.S. Army's Enhanced Vision Goggles (EN-VGs) and the multiple-adaptable night tactical imaging system (MANTIS). As illustrated, the night vision imager 401 includes an array 61 of dual band detectors 10 to capture a dual band image information. Array 61 can be coupled to a processor 63 for enhancing, or otherwise processing the image information for display upon a display 65 coupled to the processor 63.

Exemplary and non-limiting embodiments of the invention result in nearly perfect optical alignment between the SWIR or visible detectors 5 and the LWIR detector 24. Alignment accuracy depends only on the precision of the hybridization of the SWIR detectors 5 and the LWIR detectors 24, which is typically no more than a 2 um deviation from vertical alignment. As a result, because the expanse covered by both the SWIR detectors 5 and the LWIR detectors 24 are superimposed, generally, over the same area, the captured SWIR image information and LWIR image information are substantially co-registered. By "co-registered" it is meant that the X-Y coordinate of a pixel in a first image can be mapped to the X-Y position of a pixel in a second image without the need for scaling, rotating, or shifting either image.

It is often times desirable to combine the SWIR image information with the LWIR image information to produce a single image for viewing on the display 65. Because, typically, such image information is captured using more than one detector each devoted exclusively to capturing one wavelength of light, there is required the combination of more than one source of image information that are not co-registered. As a result, one must typically employ computationally intensive signal processing to shift, scale, and rotate an image from one band, either SWIR or LWIR, until it is aligned, or registered, with the image from the other band. Because the dual band detector 10 according to exemplary embodiments of the invention includes both SWIR detectors 5 and LWIR detectors 24 forming a single array, the resulting image information provided from the dual band detector 10 is formed of co-registered image information for each wavelength that does not need additional image shifting to register the bands.

Figure 6:
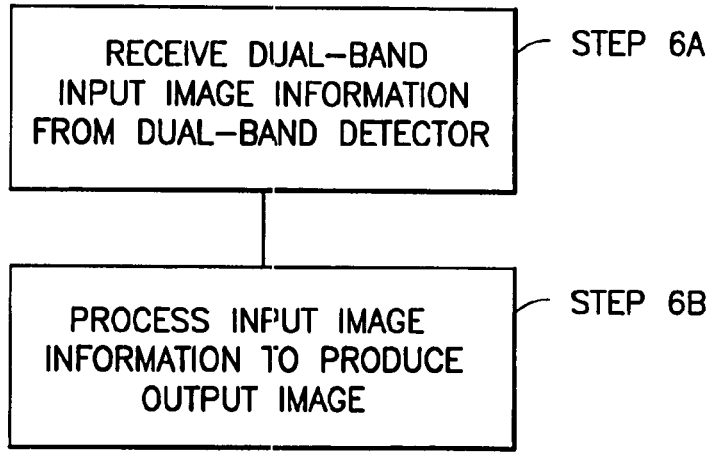
FIG. 6 is a flow diagram of a method according to an exemplary embodiment of the invention.

With reference to FIG. 6, there is illustrated a flow diagram of a method according to an exemplary embodiment of the invention. At step 6A, a single input image information that includes co-registered images corresponding to at least two separate wavelengths of light is received by, for example, processor 63. At step 6B, processor 63 performs operations upon the input image information. This image processing may be implemented via the execution of software embodied in a signal bearing medium, or memory 67, coupled to the processor 63. Alternatively, the image processing can be implemented through hardware, such as an integrated circuit, fabricated to perform such processing. The result of the image processing is an output image formed of some combination of the dual-band image information included in the input image information.

The construction of the dual band detector 10 can be accomplished in accordance with conventional integrated circuit fabrication techniques, and can generally follow the procedure described in the commonly assigned U.S. Pat. No. 6,144,030, with modifications being made to accommodate the aspects of exemplary and non-limiting embodiments of the invention described above.

The foregoing teachings have been described in the context of various dimensions, material types, wavelengths and the like, it can be appreciated that these are exemplary and non-limiting embodiments of the invention, and are not intended to be read in a limiting matter upon these teachings. For example, other types of IR absorber materials can be employed, besides silicon nitride, other types of metal systems can be used, besides NiCr, and other types of thermal resistors can be employed, other than $VO_x$.

Thus, while these teachings have been particularly shown and described with respect to exemplary embodiments of the invention, it will be understood by those skilled in the art that changes in form and details may be made therein without departing from the scope and spirit of these teachings.

We claim:

1. A dual band microbolometer, comprising:
 a radiation absorbing layer for absorbing light of a first wavelength;
 a readout circuit (ROIC);
 a multi-layer thermal isolation leg structure comprising a first layer electrically coupling the radiation absorbing layer to the ROIC and a second layer thermally sinking the leg structure to the ROIC; and
 at least one radiation detector for detecting light of a second wavelength, the at least one radiation detector electrically coupled to said ROIC via a corresponding opening extending through said radiation absorbing layer;
 wherein said radiation absorbing layer is comprised of at least one of Vanadium oxide and Titanium oxide.

2. The dual band microbolometer of claim 1 wherein said at least one radiation detector is comprised of at least one of a Si PIN photodiode, an InGaAs photodiode, and a HgCdTe photodiode.

3. The dual band microbolometer of claim 1 wherein said light of said first wavelength comprises long wave infrared (LWIR) radiation and said light of said second wavelength comprises short wave infrared (SWIR) radiation.

4. The dual band microbolometer of claim 3 wherein said at least one radiation detector is substantially transparent to LWIR radiation.

5. The dual band microbolometer of claim 1, further comprising:
 a processor coupled to said ROIC for processing image information output therefrom; and
 a display coupled to said processor for displaying said processed image information.

6. The dual band microbolometer of claim 1, wherein there are a plurality of radiation detectors for detecting light of the second wavelength, each coupled to said ROIC via a corresponding opening extending through said radiation absorbing layer, and where the corresponding openings are spaced from one another by a center-to-center pitch;
 and where the radiation absorbing layer is coupled to the ROIC by contacts that are spaced from one another by a center-to-center distance that is approximately twice the pitch.

7. The dual band microbolometer of claim 1, wherein the first layer comprises nickel-chromium and the second layer comprises silicon nitride.

8. The dual band microbolometer of claim 7, further comprising a second leg structure coupling the radiation absorbing layer to the thermal isolation leg structure via a multi-layer substantially parallel with the radiation absorbing layer such that the thermal isolation leg structure and the second leg structure are laterally spaced from one another across the substantially parallel multi-layer.

9. The dual band microbolometer of claim 8, wherein the substantially parallel multi-layer comprises a layer of nickel-chromium sandwiched between layers of silicon nitride.

10. The dual band microbolometer of claim 1, wherein said light of said first wavelength comprises long wave infrared (LWIR) radiation and said light of said second wavelength comprises medium wave infrared (MWIR) radiation;

and wherein the radiation absorbing layer is disposed between the radiation detector and the ROIC.

11. The dual band microbolometer of claim 1, wherein the radiation absorbing layer is electrically isolated from the detector.

12. A dual band microbolometer for outputting image information, comprising:

a radiation absorbing layer for absorbing light of a first wavelength wherein said radiation absorbing layer is comprised of at least one of Vanadium oxide and Titanium oxide;

a readout circuit (ROIC);

a multi-layer thermal isolation leg structure comprising a first layer electrically coupling the radiation absorbing layer to the ROIC and a second layer thermally sinking the leg structure to the ROIC;

at least one radiation detector for detecting light of a second wavelength, the at least one radiation detector electrically coupled to said ROIC via a corresponding opening extending through said radiation absorbing layer;

means for processing coupled to said dual band imager for processing said image information; and means for displaying coupled to said means for processing for displaying said processed image information.

13. The dual band microbolometer of claim 12, wherein there are a plurality of radiation detectors for detecting light of the second wavelength, each coupled to said ROIC via a corresponding opening extending through said radiation absorbing layer, and where the corresponding openings are spaced from one another by a center-to-center pitch;

and where the radiation absorbing layer is coupled to the ROIC by contacts that are spaced from one another by a center-to-center distance that is approximately twice the pitch.

14. The dual band microbolometer of claim 12, wherein the first layer comprises nickel-chromium and the second layer comprises silicon nitride.

15. The dual band microbolometer of claim 14, further comprising a second leg structure coupling the radiation absorbing layer to the thermal isolation leg structure via a multi-layer substantially parallel with the radiation absorbing layer such that the thermal isolation leg structure and the second leg structure are laterally spaced from one another across the substantially parallel multi-layer.

16. The dual band microbolometer of claim 15, wherein the substantially parallel multi-layer comprises a layer of nickel-chromium sandwiched between layers of silicon nitride.

17. The dual band microbolometer of claim 12, wherein said light of said first wavelength comprises long wave infrared (LWIR) radiation and said light of said second wavelength comprises medium wave infrared (MWIR) radiation;

and wherein the radiation absorbing layer is disposed between the detector and the ROIC.

18. The dual band microbolometer of claim 12, wherein the radiation absorbing layer is electrically isolated from the radiation detector.

* * * * *